(12) United States Patent
Lee et al.

(10) Patent No.: US 8,771,423 B2
(45) Date of Patent: *Jul. 8, 2014

(54) LOW SLOPED EDGE RING FOR PLASMA PROCESSING CHAMBER

(71) Applicant: Applied Materials, Inc., Santa Clara, CA (US)

(72) Inventors: Changhun Lee, San Jose, CA (US); Michael D. Willwerth, Campbell, CA (US); Hoan Nguyen, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 12 days.

This patent is subject to a terminal disclaimer.

(21) Appl. No.: 13/649,196

(22) Filed: Oct. 11, 2012

(65) Prior Publication Data

US 2013/0032478 A1 Feb. 7, 2013

Related U.S. Application Data

(63) Continuation of application No. 12/207,695, filed on Sep. 10, 2008, now Pat. No. 8,287,650.

(51) Int. Cl.
*C23C 16/50* (2006.01)
*C23C 16/00* (2006.01)
*C23F 1/00* (2006.01)
*H01L 21/306* (2006.01)

(52) U.S. Cl.
USPC ..................... 118/728; 156/345.51

(58) Field of Classification Search
USPC ................ 118/724, 725, 728–730; 156/345.51–345.53
See application file for complete search history.

(56) References Cited

U.S. PATENT DOCUMENTS

| | | | |
|---|---|---|---|
| 5,958,265 A * | 9/1999 | Ogahara | 219/121.43 |
| 6,284,093 B1 | 9/2001 | Ke et al. | |
| 6,454,865 B1 | 9/2002 | Goodman et al. | |
| 6,872,281 B1 | 3/2005 | Chen et al. | |
| 2004/0027781 A1 | 2/2004 | Hanawa et al. | |
| 2005/0005859 A1 | 1/2005 | Koshiishi et al. | |
| 2005/0061447 A1 | 3/2005 | Kim et al. | |
| 2007/0102286 A1 | 5/2007 | Scheible et al. | |
| 2007/0102295 A1 | 5/2007 | Sundberg et al. | |
| 2007/0256785 A1 | 11/2007 | Pamarthy et al. | |

FOREIGN PATENT DOCUMENTS

JP 08-264515 A 10/1996

OTHER PUBLICATIONS

PCT international search report and written opinion of PCT/US2009/055596 dated Apr. 14, 2010.

* cited by examiner

*Primary Examiner* — Maureen Gramaglia
*Assistant Examiner* — Tiffany Nuckols
(74) *Attorney, Agent, or Firm* — Patterson & Sheridan, LLP

(57) ABSTRACT

Embodiments of a cover ring for use in a plasma processing chamber are provided. In one embodiment, a cover ring for use in a plasma processing chamber includes a ring-shaped body fabricated from a yttrium (Y) containing material. The body includes a bottom surface having an inner locating ring and an outer locating ring. The inner locating ring extends further from the body than the outer locating ring. The body includes an inner diameter wall having a main wall and a secondary wall separated by a substantially horizontal land. The body also includes a top surface having an outer sloped top surface meeting an inner sloped surface at an apex. The inner sloped surface defines an angle with a line perpendicular to a centerline of the body less than about 70 degrees.

4 Claims, 3 Drawing Sheets

LOW SLOPED EDGE RING FOR PLASMA PROCESSING CHAMBER

CROSS-REFERENCE TO RELATED APPLICATIONS

This application a continuation of U.S. patent application Ser. No. 12/207,695, filed Sep. 10, 2008, now U.S. Pat. No. 8,287,650, which is herein incorporated by reference.

BACKGROUND OF THE INVENTION

1. Field of Invention

Embodiments of the present invention generally relate to a cover ring for use in a plasma processing chamber.

2. Description of the Related Art

Semiconductor processing involves a number of different chemical and physical processes whereby minute integrated circuits are created on a substrate. Layers of materials which make up the integrated circuit are created by numerous plasma processes, such as chemical vapor deposition, physical vapor deposition and the like. Some of the layers of material are patterned using photoresist masks and etched using plasma etching techniques to form the structures and devices utilized to form integrated circuits.

During plasma etching processing, the energized gas which drives the etching process may not be uniformly distributed above the substrate being etched. The plasma non-uniformity may contribute to poor processing results, particularly near the edge of the substrate. Some etching chambers utilized chamber components such as edge and cover rings to improve processing results. However, as critical dimensions shrink and fabricators strive to pack move devices on a single substrate, processing techniques and components must be improved in order to enable next generation products in a timely and cost effective manner.

Moreover, by-products may form on chamber components during the etching process. These by-products require chamber components to be periodically cleaned to prevent inconsistent or undesirable processing results. Improvements to chamber component designs which reduce potential contamination sources and the time between cleaning and/or component replacement is beneficial. Thus, there is a need for improved chamber components.

SUMMARY

Embodiments of a cover ring for use in a plasma processing chamber are provided. In one embodiment, a cover ring for use in a plasma processing chamber includes a ring-shaped body fabricated from a yttrium (Y) containing material. The body includes a bottom surface having an inner locating ring and an outer locating ring. The inner locating ring extends further from the body than the outer locating ring. The body includes an inner diameter wall having a main wall and a secondary wall separated by a substantially horizontal land. The body also includes a top surface having an outer sloped top surface meeting an inner sloped surface at an apex. The inner sloped surface defines an angle with a line perpendicular to a centerline of the body less than about 70 degrees.

In another embodiment, a cover ring for use in a plasma processing chamber includes a ring-shaped body fabricated from a yttrium (Y) containing material. The body includes a bottom surface having an inner locating ring and an outer locating ring. The inner locating ring extends further from the body than the outer locating ring. The body also includes a top surface having a substantially horizontal main top surface, a substantially horizontal inner top surface and a substantially horizontal land. The main top surface is positioned outward of and above the inner top surface. The inner top surface is positioned outward of and above the land.

In some embodiments, the cover ring is fabricated from bulk yttrium oxide ($Y_2O_3$).

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings.

Figure 1:
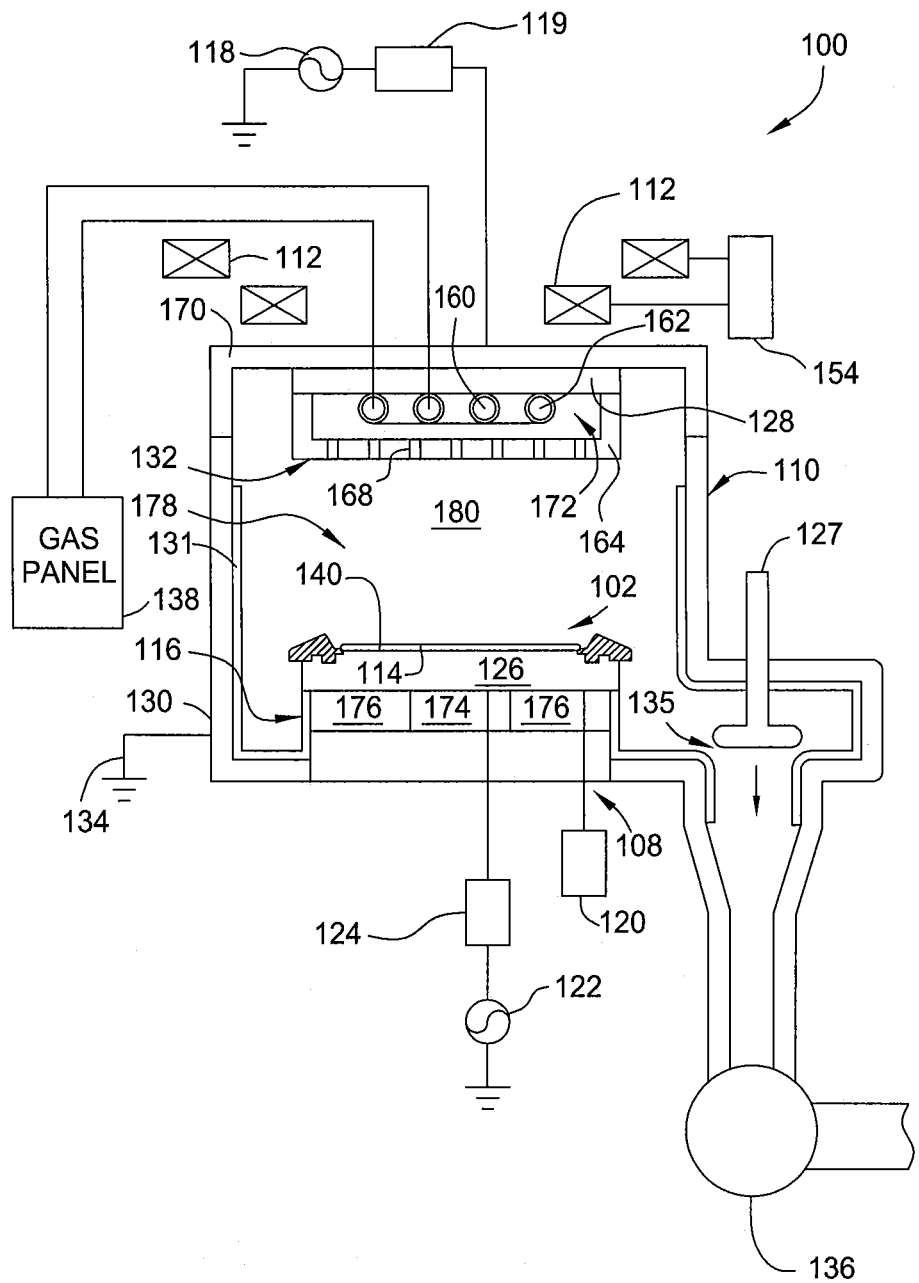
FIG. 1 depicts a schematic diagram of one embodiment of an exemplary plasma etch chamber that may benefit from embodiments of the invention.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention provide chamber components with enhanced etching performance and service life. In one embodiment, the chamber component is a cover ring adapted to engage a substrate disposed on a substrate support pedestal.

FIG. 1 depicts a schematic, cross-sectional diagram of one embodiment of an exemplary plasma processing chamber 100 that can benefit from embodiments of the invention. The embodiment of the chamber shown herein is provided for illustrative purposes and should not be used to limit the scope of the invention. One example of a plasma processing chamber that may be adapted to benefit from the invention is a DPS AdvantEdge™ etch reactor, available from Applied Materials, Inc., of Santa Clara, Calif. It is contemplated that other plasma processing chambers may be adapted to benefit from the invention, including those from other manufacturers.

The chamber 100 comprises a vacuum chamber body 110 having a conductive chamber wall 130 and bottom 108. The chamber wall 130 is connected to an electrical ground 134. A lid 170 is disposed on the chamber wall 130 to enclose an interior volume 178 defined within the chamber body 110. At least one coil segment 112 is positioned exterior to the chamber wall 130. The coil segment(s) 112 may be selectively energized by a DC power source 154 that is capable of producing at least 5V to provide a control knob for plasma processes formed within the processing chamber 100.

A liner 131 is disposed within the interior volume 178 to facilitate cleaning of the chamber 100. The byproducts and residue of the etch process may be readily removed from the liner 131 at selected intervals.

A substrate support pedestal 116 is disposed on the bottom 108 of the process chamber 100 below the gas diffuser 132. A process region 180 is defined within the interior volume 178 between the substrate support pedestal 116 and a diffuser 132.

The substrate support pedestal 116 may include an electrostatic chuck 126 for retaining a substrate 114 on a surface 140 of the pedestal 116 beneath the gas diffuser 132 during processing. The electrostatic chuck 126 is controlled by a DC power supply 120.

In one embodiment, a cover ring 102 is disposed around an outer perimeter of the pedestal 116 and substantially circumscribes the substrate 114. A portion of the cover ring 102 may be disposed under the edge of the substrate 114. In one embodiment, the cover ring 102 is comprised of a yttrium (Y) containing material, for example, bulk yttrium oxide ($Y_2O_3$). The material of the cover ring 102 provides enhanced corrosion resistance, thereby improving the service lifetime of the chamber component, while reducing maintenance and manufacturing cost. Additional details about the cover ring 102 will be discussed below in connection with FIG. 2.

The support pedestal 116 may be coupled to an RF bias source 122 through a matching network 124. The bias source 122 is generally capable of producing an RF signal having a tunable frequency of 2 kHz to 13.56 MHz and a power of between 0 and 5000 Watts. Optionally, the bias source 122 may be a DC or pulsed DC source.

The support pedestal 116 may also include inner and outer temperature regulating zones 174, 176. Each zone 174, 176 may include at least one temperature regulating device, such as a resistive heater or a conduit for circulating coolant, so that the radial temperature gradient of the substrate disposed on the pedestal may be controlled.

The interior of the chamber 100 is a high vacuum vessel that is coupled to a vacuum pump 136 through an exhaust port 135 formed through the chamber wall 130 and/or chamber bottom 108. A throttle valve 127 disposed in the exhaust port 135 is used in conjunction with the vacuum pump 136 to control the pressure inside the processing chamber 100. The position of the exhaust port 135 and other flow restrictions within the interior volume 178 of the chamber body 110 greatly influence the conductance and gas flow distribution within the processing chamber 102.

The gas diffuser 132 provides a conduit through which at least one process gas is introduced into the processing region 180. In one embodiment, the gas diffuser 132 may provide process gases to the region 180 in an asymmetrical manner that may be used to tune the conductance and gas flow distribution described above that are caused by the other chamber components (i.e., location of the exhaust port, geometry of the substrate support pedestal or other chamber component) so that the flow of gases and species are delivered to the substrate in a uniform, or selected, distribution.

In one embodiment illustratively depicted in FIG. 1, the gas diffuser 132 includes at least two gas distributors 160, 162, a mounting plate 128 and a gas distribution plate 164. The gas distributors 160, 162 are coupled to one or more gas panels 138 through the lid 170 of the processing chamber 100, and are also coupled to at least one of the mounting or gas distribution plates 128, 164. The flow of gas through the gas distributors 160, 162 may be independently controlled. Although the gas distributors 160, 162 are shown coupled to a single gas panel 138, it is contemplated that the gas distributors 160, 162 may be coupled to one or more shared and/or separate gas sources. Gases provided from the gas panel 138 are delivered into a region 172 defined between the plates 128, 164, then exit through a plurality of apertures 168 formed through the gas distribution plate 164 into the processing region 180.

The mounting plate 128 is coupled to the lid 170 opposite the support pedestal 116. The mounting plate 128, which is fabricated from or covered by an RF conductive material, is coupled to an RF source 118 through an impedance transformer 119 (e.g., a quarter wavelength matching stub). The source 118 is generally capable of producing an RF signal having a tunable frequency between about 60 MHz and about 162 MHz and a power between about 0 and 3000 Watts. The mounting plate 128 and/or gas distribution plate 164 is powered by the RF source 118 to maintain a plasma formed from the process gases in the process region 180.

Figure 2:
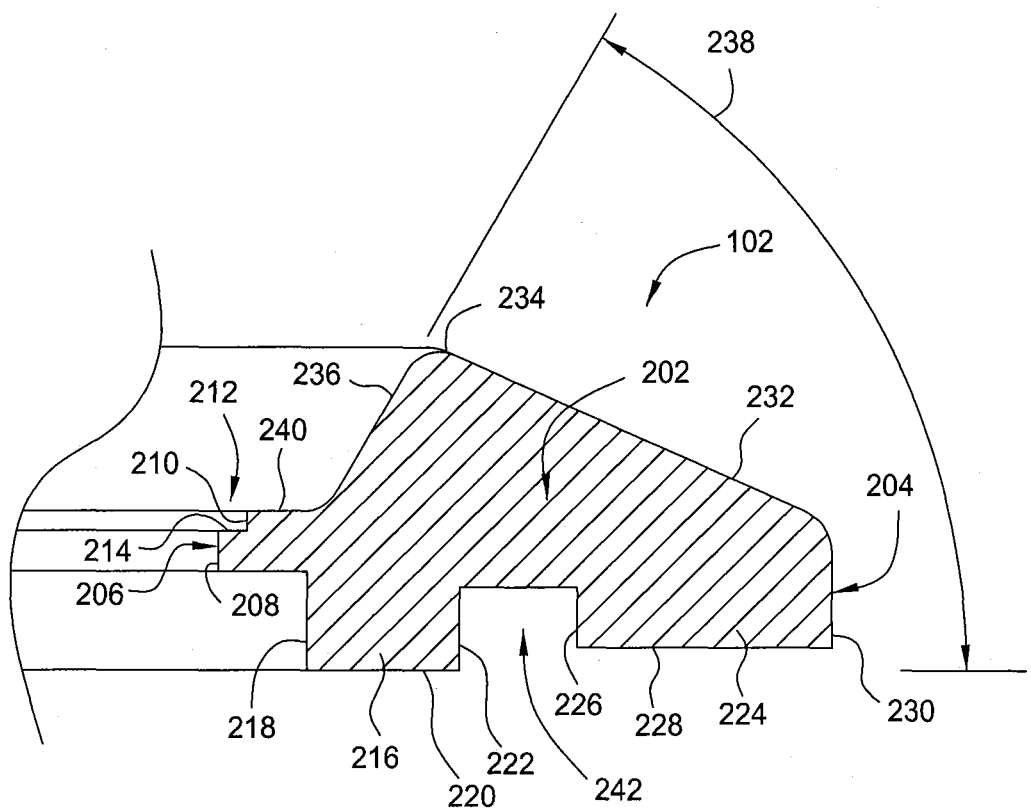
FIG. 2 is a partial schematic cross-sectional view of the cover ring of FIG. 1.

FIG. 2 is a partial sectional view of one embodiment of the cover ring 102. The cover ring 102 has a body 202 comprised of a yttrium (Y) containing material. In one embodiment, the body 202 may be comprised of bulk yttrium oxide ($Y_2O_3$) or other suitable material. Alternatively, the body 202 may comprise yttrium (Y) metal, yttrium alloy and the like. In yet other embodiments, the body 202 may be comprised of yttrium doped materials, such as yttrium doped quartz, yttrium doped aluminum (Al) metal, yttrium doped aluminum oxide ($Al_2O_3$), yttrium doped aluminum alloy or yttrium doped aluminum nitrogen (AlN).

In the embodiment of FIG. 2, the body 202 includes an outer diameter 204 and an inner diameter 206. In one embodiment, the inner diameter 206 of the cover ring 102 is about 11.50 to about 11.75 inches. The inner diameter 206 of the cover ring 102 includes a main wall 208 and a secondary wall 210. The main wall 208 has a diameter less than a diameter of the secondary wall 210. The main and secondary walls 208, 210 generally have a vertical orientation, with main wall 208 having a greater length in the vertical direction than the secondary wall 210. The main wall 208 is also below the secondary wall 210.

A step 212 is defined between the main wall 208 and the secondary wall 210. The step 212 includes a substantially horizontal land 214 extending between the main and secondary walls 208, 210. The step 212 defines a substrate receiving pocket such that the perimeter of the substrate 114 extends over a portion of the land 214, as shown in FIG. 1.

The body 202 of the cover ring 102 also includes an inner locating ring 216 and an outer locating ring 224 extending from a bottom surface of the body 202. The inner locating ring 216 includes an inner wall 218, a bottom 220 and an outer wall 222. The inner and outer walls 218, 222 are substantially vertical and concentric in orientation, while the bottom 220 is substantially horizontal. The inner wall 216 has a diameter greater than the diameter of the secondary wall 210.

The outer locating ring 224 is disposed outward of the inner locating ring 216 and includes an inner wall 226, a bottom 228 and an outer wall 230. The inner and outer walls 226, 230 are substantially vertical and concentric in orientation, while the bottom 228 is substantially horizontal. The bottom 228 of the outer locating ring 224 projects a shorter distance from the body 202 than bottom 220 of the inner locating ring 216. The outer wall 230 of the outer locating ring 224 lies on the outer diameter 204.

The inner and outer locating rings 216, 224 define a notch 242 in the bottom surface of the cover ring 102. The notch 242 is configured to engage a mating feature on the pedestal 116, such that the cover ring 102 is precisely located on the pedestal 116 within the chamber 100.

The top surface of the body 202 includes an outer sloped top surface 232, an inner sloped top surface 236 and an inner top surface 240. The inner top surface 240 is substantially horizontal in orientation, and extends from the inner sloped top surface 236 to the secondary wall 210.

The outer sloped top surface 232 and the inner sloped top surface 236 meet at an apex 234 of the cover ring 102. The inner sloped top surface 236 generally slopes upward and outward, and is orientated at an angle 238 of less than about 70 degrees relative to a line defined perpendicular to a centerline of the cover ring 102, for example, as defined by the bottom 228 of the outer locating loop 224. In one embodiment, the angle 238 is about 60 degrees. The slope of the inner sloped top surface 236 has an orientation projected in the horizontal plane which allows ions and reactive species utilized during in-situ ring cleaning to have a more direct impact the projected surface. Thus, the ion impact energy and/or quantity of reactive species impinging on the top surface 236 during in-situ cleaning of the ring dramatically improves cleaning of the cover ring 102. The shape of the cover ring 102 significantly increases the number of substrates processed prior to requiring the cover ring 102 removed for ex-situ cleaning outside the chamber 100. Compared to conventional rings, the improved cover ring 102 has demonstrated an improvement of RF hours between clean from 300 RF/hrs for convention rings to about 1000 RF/hrs. Moreover, since the slope of the inner sloped top surface 236 has an orientation that enhances in-situ cleaning, less etch by-products, particularly polymer by-products commonly present during metal etch processes, such as aluminum etching, are present on the cover ring 102 after in-situ cleaning. With less by-products on the cover ring 102, the potential for particle defects during subsequent processing is advantageously reduced. The cleaner cover 102 ring also enhances substrate to substrate etching results, and as demonstrated by reduced microloading effects along with allowing structures to be precisely fabricated closer to the edge of the substrate (as compared to conventional techniques).

Figure 3:
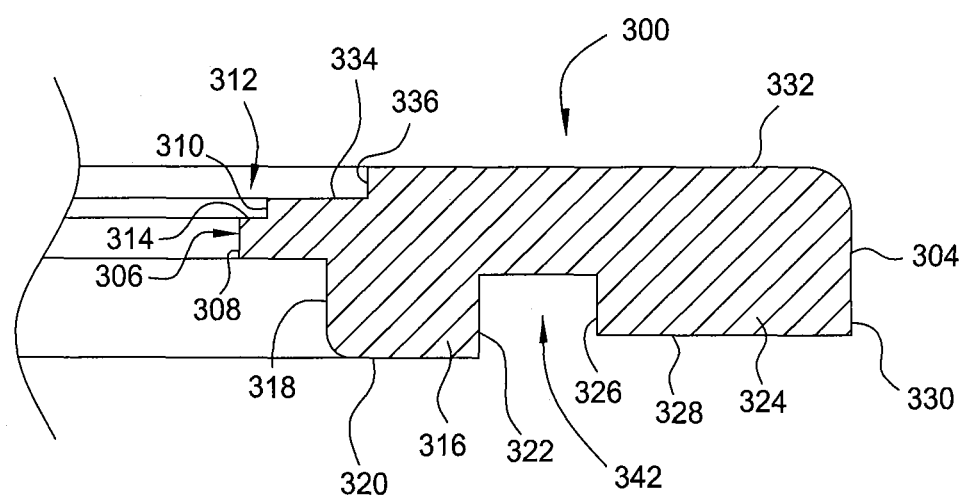
FIG. 3 is a partial schematic cross-sectional view of another embodiment of a cover ring.

FIG. 3 depicts another embodiment of a cover ring 300 which may be beneficially utilized in the processing chamber 100 described above, among other plasma processing chambers. The cover ring 300 generally includes a body 302 that may be fabricated from the materials identified above with reference to the body 202 of the cover ring 102.

In the embodiment of FIG. 3, the body 302 includes an outer diameter 304 and an inner diameter 306. In one embodiment, the inner diameter 306 of the cover ring 102 is about 11.50 to about 11.75 inches. The inner diameter 306 of the cover ring 102 includes a main wall 308 and a secondary wall 310. The main wall 308 has a diameter less than a diameter of the secondary wall 310. The main and secondary walls 308, 310 generally have a vertical and concentric orientation, with main wall 308 having a greater length in the vertical direction than the secondary wall 310. The main wall 308 is also below the secondary wall 310.

A step 312 is defined between the main wall 308 and the secondary wall 310. The step 312 includes a substantially horizontal land 314 extending between the main and secondary walls 308, 310. The step 312 defines a substrate receiving pocket such that the perimeter of the substrate 114 extends over a portion of the land 314 when positioned on the pedestal 116, similar to the land 214 of the cover ring 102 shown in FIG. 1.

The body 302 of the cover ring 102 also includes an inner locating ring 316 and an outer locating ring 324 extending from a bottom surface of the body 302. In one embodiment, the inner locating ring 316 and the outer locating ring 324 may be essentially identical to the inner and outer locating rings 216, 224 of the cover ring 102 described above.

In one embodiment, the inner locating ring 316 includes an inner wall 318, a bottom 320 and an outer wall 322. The inner and outer walls 318, 322 are substantially vertical in orientation, while the bottom 320 is substantially horizontal. The inner wall 316 has a diameter greater than the diameter of the secondary wall 310.

The outer locating ring 324 is disposed outward of the inner locating ring 316 and includes an inner wall 326, a bottom 328 and an outer wall 330. The inner and outer walls 326, 330 are substantially vertical and concentric in orientation, while the bottom 328 is substantially horizontal. The bottom 328 of the outer locating ring 324 projects a shorter distance from the body 302 than bottom 320 of the inner locating ring 316. The outer wall 330 of the outer locating ring 324 lies on the outer diameter 304.

The inner and outer locating rings 316, 324 define a notch 342 in the bottom surface of the cover ring 102. The notch 342 is configured to engage a mating feature on the pedestal 116 such that the cover ring 300 may be precisely positioned on the pedestal 116.

The top surface of the body 302 includes a main top surface 332, an inner top surface 334 and the land 314. The main top surface 332 and the inner top surface 334 are substantially horizontal in orientation, with the main top surface 332 positioned outward of the inner top surface 334. The inner top surface 334 is recessed below the main top surface 332, while the land 314 is recessed below the inner top surface 334.

A wall 336 is disposed between the main top surface 332 and the inner top surface 334. The wall 336 has a substantially vertical orientation, and is concentric with the wall 310.

The substantially horizontal orientation of the top surfaces 332, 334 promotes improved in-situ cleaning of the ring by allowing more direct ion impact and exposure to more reactive species. As discussed above, the improved cover ring 300 has demonstrated a significant improvement of RF hours between cleans, reduces particle generation and reduced microloading effects.

Thus, embodiments of a cover ring have been provided that allow devices to be fabricated closer to the perimeter of the substrate than conventional designs by promoting plasma uniformity and reduced microloading. Moreover, the configuration of the ring enhances cleaning, thereby improving substrate to substrate processing and reducing the potential of particle generation due to incomplete particle removal during cleaning.

While the foregoing is directed to embodiments of the present invention, other and further embodiments of the invention may be devised without departing from the basic scope thereof, and the scope thereof is determined by the claims that follow.

What is claimed is:

1. A cover ring for use in a plasma processing chamber, comprising of:
   a ring-shaped body fabricated from a yttrium (Y) containing material, the body comprising of:
   a bottom surface having an inner locating ring and an outer locating ring, the inner locating ring extending further from the body than the outer locating ring, the inner locating ring having an inner wall, the inner wall facing a centerline of the ring-shaped body, wherein the outer locating ring has an outer wall defining an outer diameter of the cover ring, the outer wall of the outer locating ring is configured to cover an outer most diameter of a substrate support, the bottom of the outer locating ring extends below the bottom of the body but less than the bottom of the inner locating ring;
   a notch defined in the bottom surface between the inner locating ring and the outer locating ring;
   an inner diameter wall having a main wall and a secondary wall separated by a substantially horizontal land, the secondary wall having a diameter greater than the main wall less than the inner wall of the inner locating ring, and wherein the main wall is above the notch; and a top surface having a substantially horizontal main top surface, and wherein the inner wall of the inner locating ring is radially inward of the main top surface, the outer locating ring is radially outward of the main top surface, a substantially horizontal inner top surface and the substantially horizontal land, the main top surface positioned outward of and above the inner top surface, the inner top surface positioned outward of and above the land, and wherein the secondary wall and the substantially horizontal land define a substrate-receiving pocket, and the inner and outer locating ring are radially outward of the substrate receiving step.

2. The cover ring of claim 1, wherein the body is fabricated from bulk yttrium oxide ($Y_2O_3$).

3. The cover ring of claim 1, wherein the body is fabricated from a material selected from a group consisting of yttrium metal, yttrium alloy, and yttrium doped materials.

4. The cover ring of claim 1, wherein the inner diameter wall has a diameter from about 11.50 inches to about 11.75 inches.

* * * * *